(12) United States Patent
Ko et al.

(10) Patent No.: US 12,716,129 B2
(45) Date of Patent: Aug. 25, 2026

(54) ATOMIC LAYER DEPOSITION TOOL AND METHOD

(71) Applicant: Taiwan Semiconductor Manufacturing Co., Ltd., Hsinchu (TW)

(72) Inventors: Chung-Ting Ko, Kaohsiung City (TW); Wen-Ju Chen, New Taipei City (TW); Wan-Chen Hsieh, Hsinchu (TW); Ming-Fa Wu, Kaohsiung City (TW); Tai-Chun Huang, Hsinchu (TW); Yung-Cheng Lu, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 1018 days.

(21) Appl. No.: 17/813,876

(22) Filed: Jul. 20, 2022

(65) Prior Publication Data

US 2022/0356573 A1 Nov. 10, 2022

Related U.S. Application Data

(62) Division of application No. 16/656,876, filed on Oct. 18, 2019, now Pat. No. 11,530,479.

(51) Int. Cl.
*H10P 72/00* (2026.01)
*C23C 16/44* (2006.01)
*C23C 16/52* (2006.01)

(52) U.S. Cl.
CPC .......... *C23C 16/4412* (2013.01); *C23C 16/52* (2013.01); *H10P 72/0402* (2026.01); *C03C 2217/76* (2013.01)

(58) Field of Classification Search
CPC .................................................. H10P 72/0462
See application file for complete search history.

(56) References Cited

U.S. PATENT DOCUMENTS 5,198,053 A * 3/1993 Duncan ................. B29C 66/929 277/575
5,578,131 A 11/1996 Ye et al.
(Continued)

FOREIGN PATENT DOCUMENTS

CN 106414803 A 2/2017
CN 108754455 A 11/2018
(Continued)

OTHER PUBLICATIONS

Jing, Zhou, "Synthetic resin and plastic molding; Book Two; PTFE plastic molding," Sep. 1959, 4 pages, Chemical Industry Press, Beijing, China.

*Primary Examiner* — Ali Naraghi
(74) *Attorney, Agent, or Firm* — Slater Matsil, LLP

(57) ABSTRACT

In an embodiment, a method of forming a semiconductor device includes forming a hydrophobic coating on an inner surface of an exhaust line, connecting the exhaust line to a semiconductor processing chamber, introducing a first precursor into the semiconductor processing chamber, introducing a second precursor into the semiconductor processing chamber, wherein the first precursor reacts with the second precursor to form a layer of oxide material, and pumping the first precursor and the second precursor from the semiconductor processing chamber and through the exhaust line.

20 Claims, 5 Drawing Sheets

(56) References Cited

U.S. PATENT DOCUMENTS

| | | | | |
|---|---|---|---|---|
| 5,622,565 | A * | 4/1997 | Ye | H10P 72/0448 118/723 R |
| 7,311,942 | B2 | 12/2007 | Derderian et al. | |
| 8,778,066 | B2 * | 7/2014 | Chen | C23C 16/4412 454/339 |
| 10,266,398 | B1 * | 4/2019 | Kubena | C23C 16/403 |
| 11,028,475 | B2 | 6/2021 | Shan | |
| 2002/0096113 | A1 | 7/2002 | Nguyen | |
| 2003/0031828 | A1 | 2/2003 | Kosty et al. | |
| 2003/0207032 | A1 | 11/2003 | Ahn et al. | |
| 2011/0073594 | A1 | 3/2011 | Bonn | |
| 2011/0274850 | A1 | 11/2011 | Yang et al. | |
| 2012/0274031 | A1 * | 11/2012 | Knapp | F16J 15/025 277/609 |
| 2015/0099437 | A1 * | 4/2015 | Martin | B24B 37/32 451/364 |
| 2017/0144270 | A1 | 5/2017 | Twomey et al. | |
| 2017/0294569 | A1 * | 10/2017 | Chen | H10N 50/80 |
| 2019/0001360 | A1 | 1/2019 | Lefebvre et al. | |

FOREIGN PATENT DOCUMENTS

| | | | |
|---|---|---|---|
| EP | 1197994 | A1 | 4/2002 |
| FR | 1457791 | A | 1/1966 |
| TW | 200632130 | A | 9/2006 |
| TW | 201529874 | A | 8/2015 |
| TW | I539027 | B | 6/2016 |

* cited by examiner 130
202
204
H
O
X

H3C CH3
Al
CH3
CH4
210A
206

H2O
210B

212

130
152
204
202

ATOMIC LAYER DEPOSITION TOOL AND METHOD

PRIORITY CLAIM

This application is a divisional of U.S. patent application Ser. No. 16/656,876, entitled "Atomic Layer Deposition Tool and Method," filed on Oct. 18, 2019, which application is incorporated herein by reference.

BACKGROUND

Integrated circuits comprising semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. A series of chemical and physical processes may be performed during the fabrication process flow, using equipment with processing chambers that are often maintained at low pressure or partial vacuum.

The integrated circuit industry continues to improve the integration density of various electronic components (e.g., transistors, diodes, resistors, capacitors, etc.) by continual reductions in minimum feature size, which allow more components to be integrated into a given area, thereby lowering the cost of integrated circuits. Maintaining a continual reduction in manufacturing cost requires a high efficiency integrated circuit fabrication facility and infrastructure that may give rise to additional problems that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
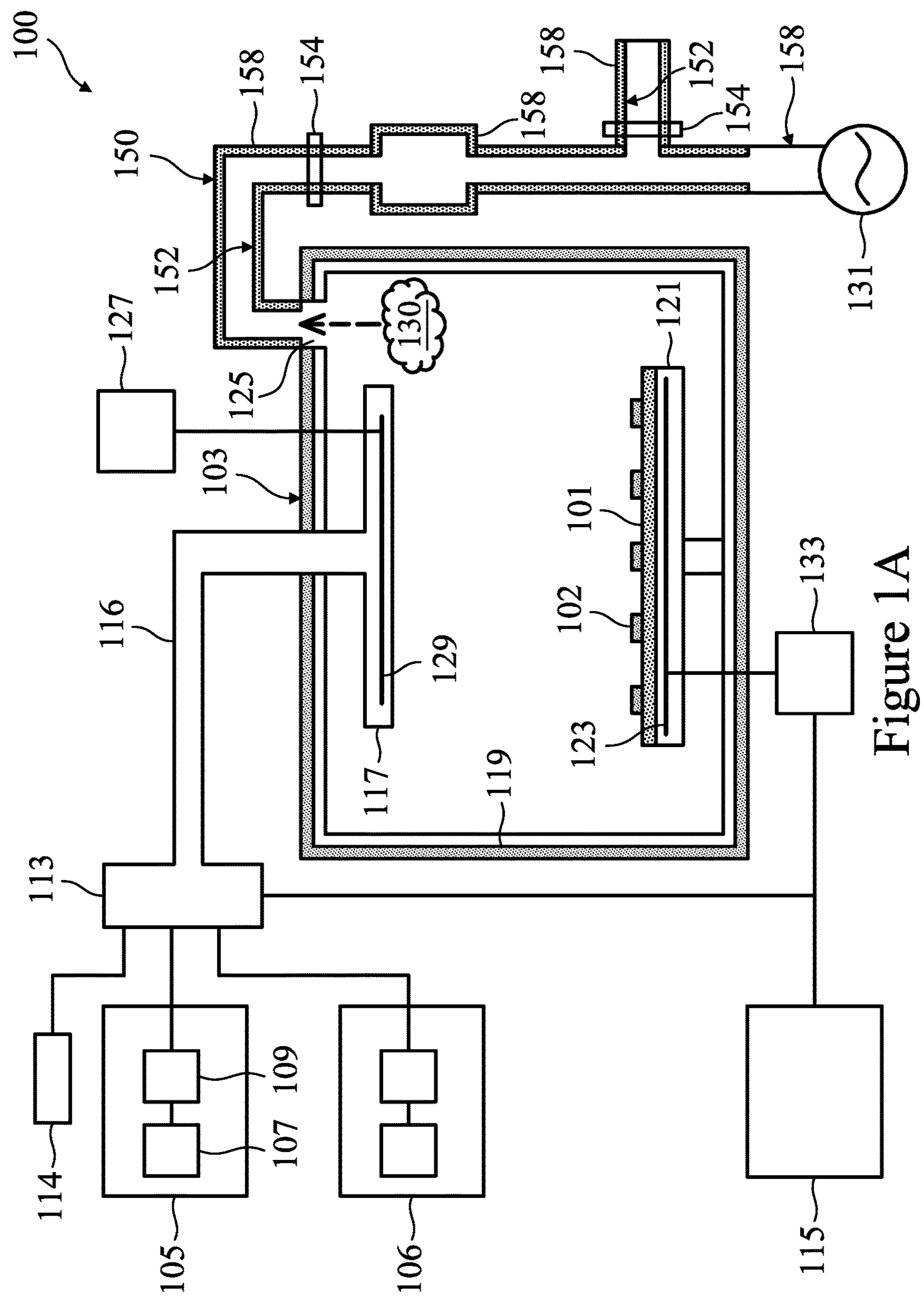
FIG. 1A illustrates a deposition system, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein describe the formation of a hydrophobic coating on inner surfaces of a deposition system in order to reduce build-up of material on the inner surfaces. For example, the exhaust lines that conduct exhaust products (e.g., purge gases, reaction byproducts, unreacted precursors, etc.) away from the deposition system may have the hydrophobic coating formed on surfaces. In particular, the coating may be formed on surfaces that are exposed to the exhaust products to reduce build-up of material formed by the exhaust products. For example, the hydrophobic coating may suppress unreacted precursors used in an Atomic Layer Deposition (ALD) process from reacting on the exposed surface to form layers of material. The hydrophobic coating may comprise a material similar to polytetrafluoroethene (e.g., Teflon). By suppressing the formation of material build-up, the use of the hydrophobic coating can increase the lifetime of deposition system components, improve performance of exhaust systems and their associated vacuum systems, and reduce maintenance costs.

Figure 1B:
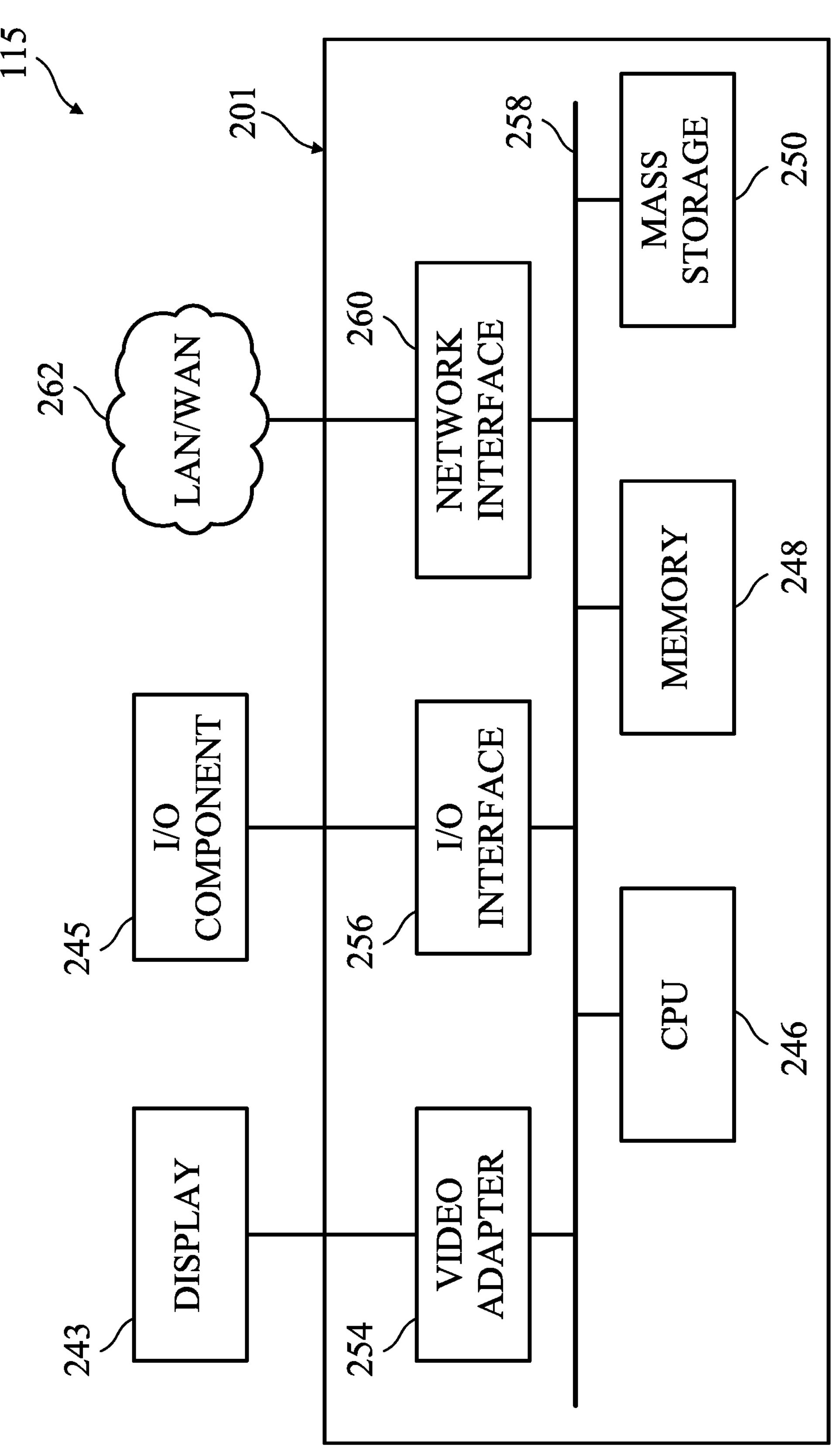
FIG. 1B illustrates a controller for a deposition system, in accordance with some embodiments.

FIGS. 1A-1B illustrate a deposition system 100, in accordance with some embodiments. The deposition system 100 may be, for example, an Atomic Layer Deposition (ALD) system, a Chemical Vapor Deposition (CVD) system, a Plasma Vapor Deposition (PVD) system, or the like that is configured to form layers of materials on a substrate 101 as part of a manufacturing process for forming semiconductor devices 102, which may include, for example, integrated circuits, FinFETs, semiconductor chips or dies, packages, interconnects, other semiconductor devices, the like, or combinations thereof. For example, the layer of materials may be thin films formed on the substrate 101 as part of a process for manufacturing the semiconductor devices 102, such as part of a process for forming a photoresist structure, an insulating layer, a dummy gate structure, a gate dielectric layer, or for forming layers utilized for other purposes. The deposition system 100 may be utilized to receive precursor materials from a first precursor delivery system 105 and a second precursor delivery system 106 and form layers of materials on the substrate 101 from the precursor materials. In an embodiment, the first precursor delivery system 105 and the second precursor delivery system 106 may work in conjunction with one another to supply the various different precursor materials to a deposition chamber 103 wherein the substrate 101 is placed. However, the first precursor delivery system 105 and the second precursor delivery system 106 may have physical components that are similar with each other.

For example, the first precursor delivery system 105 and the second precursor delivery system 106 may each include a gas supply 107 and a flow controller 109 (labeled in FIG. 1A with regards to the first precursor delivery system 105 but not labeled for clarity with respect to the second precursor delivery system 106). In an embodiment in which the first precursor is stored in a gaseous state, the gas supply 107 may supply the first precursor to the deposition chamber 103. The gas supply 107 may be a vessel, such as a gas storage tank, that is located either locally to the deposition chamber 103 or else may be located remotely from the deposition chamber 103. In another embodiment, the gas supply 107 may be a facility that independently prepares and delivers the first precursor to the flow controller 109. Any suitable source for the first precursor may be utilized as the gas supply 107, and all such sources are fully intended to be included within the scope of the embodiments.

The gas supply 107 may supply the desired precursor to the flow controller 109. The flow controller 109 may be utilized to control the flow of the precursor to the precursor gas controller 113 and, eventually, to the deposition chamber 103, thereby also helping to control the pressure within the deposition chamber 103. The flow controller 109 may be, e.g., a proportional valve, a modulating valve, a needle valve, a pressure regulator, a mass flow controller, combinations of these, or the like. However, any suitable method for controlling and regulating the flow of the gas to the precursor gas controller 113 may be utilized, and all such components and methods are fully intended to be included within the scope of the embodiments.

However, as one of ordinary skill in the art will recognize, while the first precursor delivery system 105 and the second precursor delivery system 106 have been described herein as having identical components, this is merely an illustrative example and is not intended to limit the embodiments in any fashion. Any type of suitable precursor delivery system, with any type and number of individual components identical to or different from any of the other precursor delivery systems within the deposition system 100, may be utilized. All such precursor systems are fully intended to be included within the scope of the embodiments.

Additionally, in an embodiment in which the first precursor is stored in a solid or liquid state, the gas supply 107 may store a carrier gas and the carrier gas may be introduced into a precursor canister (not separately illustrated), which stores the first precursor in the solid or liquid state. The carrier gas is then used to push and carry the first precursor as it either evaporates or sublimates into a gaseous section of the precursor canister before being sent to the precursor gas controller 113. Any suitable method and combination of units may be utilized to provide the first precursor, and all such combination of units are fully intended to be included within the scope of the embodiments.

The first precursor delivery system 105 and the second precursor delivery system 106 may supply their individual precursor materials into a precursor gas controller 113. The precursor gas controller 113 connects and isolates the first precursor delivery system 105 and the second precursor delivery system 106 from the deposition chamber 103 in order to deliver the desired precursor materials to the deposition chamber 103. The precursor gas controller 113 may include such devices as valves, flow meters, sensors, and the like to control the delivery rates of each of the precursors, and may be controlled by instructions received from the control unit 115 (described further below with respect to FIG. 1B).

The precursor gas controller 113, upon receiving instructions from the control unit 115, may open and close valves so as to connect one or more of the first precursor delivery system 105 and the second precursor delivery system 106 to the deposition chamber 103 and direct a desired precursor material through a manifold 116, into the deposition chamber 103, and to a showerhead 117. The showerhead 117 may be utilized to disperse the chosen precursor material(s) into the deposition chamber 103 and may be designed to evenly disperse the precursor material in order to minimize undesired process conditions that may arise from uneven dispersal. In an embodiment, the showerhead 117 may have a circular design with openings dispersed evenly around the showerhead 117 to allow for the dispersal of the desired precursor material into the deposition chamber 103, though any suitably configured showerhead 117 may be used.

As one of ordinary skill in the art will recognize, the introduction of precursor materials to the deposition chamber 103 through a single showerhead 117 or through a single point of introduction as described above is intended to be illustrative only and is not intended to be limiting to the embodiments. Any number of separate and independent showerheads 117 or other openings to introduce precursor materials into the deposition chamber 103 may be utilized. All such combinations of showerheads and other points of introduction are fully intended to be included within the scope of the embodiments.

The deposition chamber 103 may receive the desired precursor materials and expose the substrate 101 to the precursor materials, and the deposition chamber 103 may be any desired shape that may be suitable for dispersing the precursor materials and contacting the precursor materials with the substrate 101. In the embodiment illustrated in FIG. 1A, the deposition chamber 103 has a cylindrical sidewall and a bottom. However, the deposition chamber 103 is not limited to a cylindrical shape, and any other suitable shape, such as a hollow square tube, an octagonal shape, or the like, may be utilized. Furthermore, the deposition chamber 103 may be surrounded by a housing 119 made of material that is inert to the various process materials. As such, while the housing 119 may be any suitable material that can withstand the chemistries and pressures involved in the deposition process, in an embodiment the housing 119 may be steel, stainless steel, nickel, aluminum, alloys of these, combinations of these, and like.

Within the deposition chamber 103, the substrate 101 may be placed on a mounting platform 121 in order to position and control the substrate 101 and the semiconductor device 102 during the deposition processes. The mounting platform 121 may include heating mechanisms in order to heat the substrate 101 during the deposition processes. Furthermore, while a single mounting platform 121 is illustrated in FIG. 1A, any number of mounting platforms 121 may additionally be included within the deposition chamber 103. The mounting platform 121 may be controlled by the control unit 115, in some embodiments.

Additionally, the deposition chamber 103 and the mounting platform 121 may be part of a cluster tool system (not shown). The cluster tool system may be used in conjunction with an automated handling system in order to position and place the substrate 101 into the deposition chamber 103 prior to the deposition processes, position, hold the substrate 101 during the deposition processes, and remove the substrate 101 from the deposition chamber 103 after the deposition processes.

In some embodiments, the mounting platform 121 may additionally comprise a first electrode 123 coupled to a first RF generator 133. The first electrode 123 may be electrically biased by the first RF generator 133 (under control of the control unit 115) at a RF voltage during a deposition process. By being electrically biased, the first electrode 123 is used to provide a bias to a precursor in the deposition chamber 103 as well as facilitate igniting the precursor into a plasma. Additionally, the first electrode 123 may be also utilized to maintain the precursor as a plasma during a deposition process by maintaining the bias.

In some embodiments, the showerhead 117 may also be or comprise (or otherwise incorporate) a second electrode 129 for use as a plasma generator to assist in the deposition chamber 103. In an embodiment, the plasma generator may be a transformer coupled plasma generator and may be, e.g., a coil. The coil may be attached to a second RF generator 127 that is utilized to provide power to the second electrode 129 (under control of the control unit 115) in order to ignite the plasma during introduction of the precursor.

However, while the second electrode 129 is described above as a transformer coupled plasma generator, embodiments are not intended to be limited to a transformer coupled plasma generator. Rather, any suitable method of generating the plasma, such as inductively coupled plasma systems, magnetically enhanced reactive ion etching, electron cyclotron resonance, a remote plasma generator, or the like, may be utilized. All such methods are fully intended to be included within the scope of the embodiments.

Turning to FIG. 1B, a control unit 115 is illustrated, in accordance with some embodiments. The control unit 115 may be utilized to control the precursor gas controller 113 and the vacuum pump 131 (as illustrated in FIG. 1A), for example. The control unit 115 may be any form of computer processor that can be used in an industrial setting for controlling process machines. In an embodiment, the control unit 115 may comprise a processing unit 201, such as a desktop computer, a workstation, a laptop computer, or a dedicated unit customized for a particular application. The control unit 115 may be equipped with a display 243 and one or more input/output components 245, such as instruction outputs, sensor inputs, a mouse, a keyboard, printer, combinations of these, or the like. The processing unit 201 may include a central processing unit (CPU) 246, memory 248, a mass storage device 250, a video adapter 254, and an I/O interface 256 connected to a bus 258.

The bus 258 may be one or more of any type of several bus architectures including a memory bus or memory controller, a peripheral bus, or video bus. The CPU 246 may comprise any type of electronic data processor, and the memory 248 may comprise any type of system memory, such as static random access memory (SRAM), dynamic random access memory (DRAM), or read-only memory (ROM). The mass storage device 250 may comprise any type of storage device configured to store data, programs, and other information and to make the data, programs, and other information accessible via the bus 258. The mass storage device 250 may comprise, for example, one or more of a hard disk drive, a magnetic disk drive, or an optical disk drive.

The video adapter 254 and the I/O interface 256 provide interfaces to couple external input and output devices to the processing unit 201. As illustrated in FIG. 1B, examples of input and output devices include the display 243 coupled to the video adapter 254 and the I/O component 245, such as a mouse, keyboard, printer, and the like, coupled to the I/O interface 256. Other devices may be coupled to the processing unit 201, and more interface cards or fewer interface cards may be utilized. For example, a serial interface card (not shown) may be used to provide a serial interface for a printer. The processing unit 201 also may include a network interface 260 that may be a wired link to a local area network (LAN) or a wide area network (WAN) 262 and/or a wireless link.

It should be noted that the control unit 115 may include other components. For example, the control unit 115 may include power supplies, cables, a motherboard, removable storage media, cases, and the like. These other components, although not shown in FIG. 1B, are considered part of the control unit 115.

Turning back to FIG. 1A, the deposition chamber 103 may also have an exhaust outlet 125 through which exhaust products 130 may exit the deposition chamber 103. The exhaust products 130 may include unreacted precursor materials, reaction byproducts, purge gases, atmospheric gases, or the like. As shown in FIG. 1A, the exhaust outlet 125 may be connected to an exhaust system comprising exhaust lines 150 that conduct the exhaust products 130 away from the deposition chamber 103. In some embodiments, the exhaust lines 150 may conduct the exhaust products 130 to a containment system (not shown) that filters, scrubs, traps, or cleans the exhaust products 130. A vacuum pump system 131 may be connected to the exhaust lines 150 to facilitate evacuation of the exhaust products 130 from the deposition chamber 103. The vacuum pump system 131 may comprise one or more pumps (e.g., turbopumps, mechanical pumps, oil pumps, or the like) and may be connected to a vacuum line of a fabrication facility. In some embodiments, the exhaust lines 150 may comprise forelines, pumping lines, or the like that are connected to one or more components of the vacuum pump system 131 In some cases, the exhaust products 130 may be precursor materials, and the vacuum pump system 131 and exhaust lines 150 may be utilized to evacuate the exhaust products 130 from the deposition chamber 103 in preparation for the introduction of a subsequent precursor material. For example, during a cycle of an ALD process, the precursors of one stage of the cycle may be evacuated prior to introduction of the precursors of a later stage of the cycle. In some embodiments, one or more pumps of the vacuum pump system 131 may also be utilized to reduce and control the pressure within the deposition chamber 103 to a desired pressure by evacuating exhaust products 130. In some embodiments, the operation of one or more pumps of the vacuum pump system 131 may be controlled by the control unit 115.

The exhaust lines 150 may include one or more pipes, pipe sections, tubes, conduits, or the like that allow the exhaust products 130 to be transferred from the deposition chamber 103. Some lines 158 are labeled in FIG. 1A as illustrative examples. The lines 158 may have different diameters, shapes, lengths, or other different features. The exhaust lines 150 may also include components such as couplings, seals, valves (e.g., throttle valves, isolation valves, manual valves, or the like), junctions, or the like. Some components 154 are labeled in FIG. 1A as illustrative examples. The lines 158 or the components 154 of the exhaust lines 150 may be made of steel, stainless steel, nickel, aluminum, alloys of these, combinations of these, or the like. A line 158 or a component 154 of the exhaust lines 150 may be referred to herein as a "part" of the exhaust lines 150.

Figure 1C:
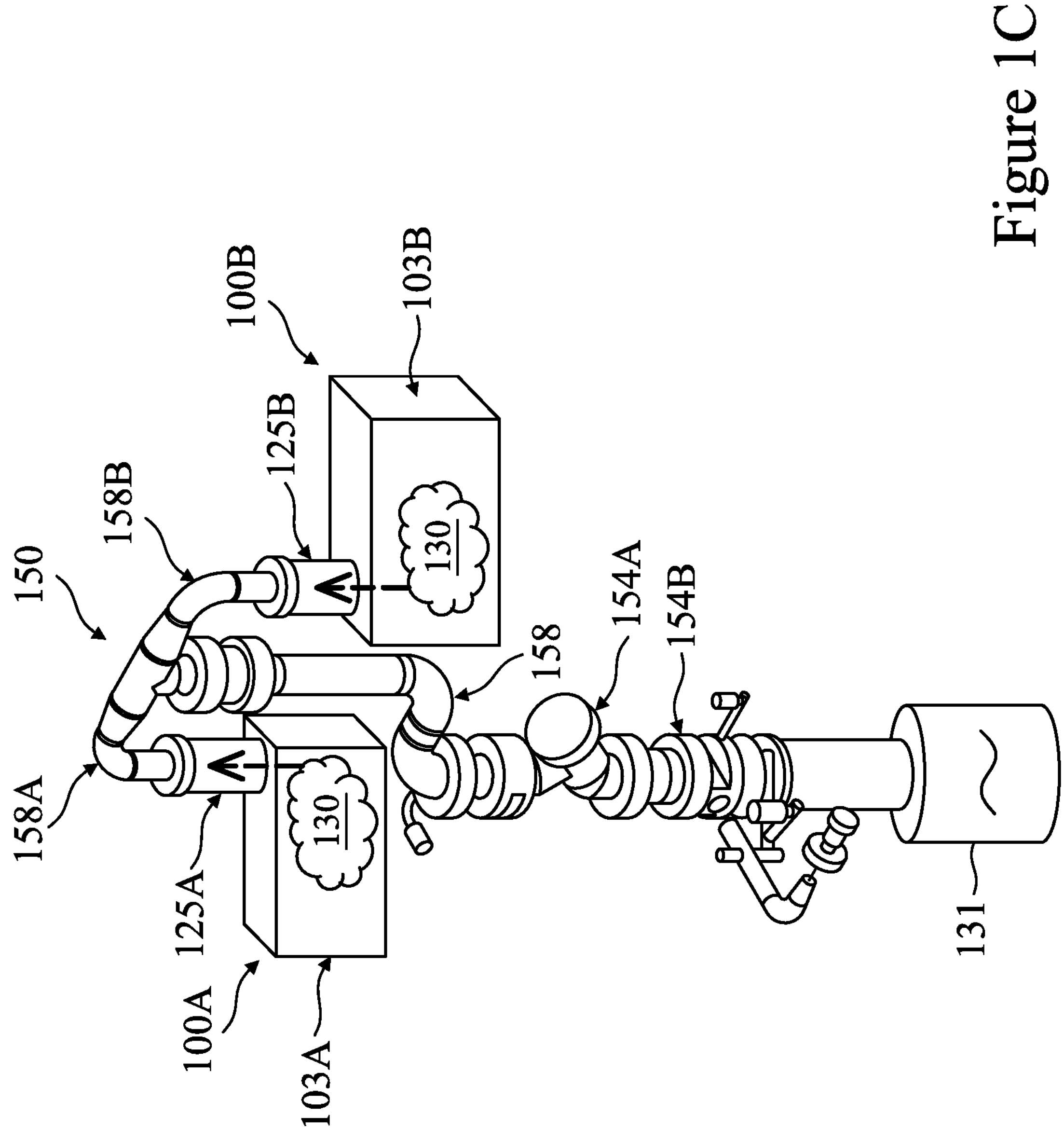
FIG. 1C illustrates an exhaust system in accordance with some embodiments.

Turning to FIG. 1C, two deposition systems 100A and 100B connected to a single set of exhaust lines 150 is shown, in accordance with some embodiments. In FIG. 1C, both deposition systems 100A and 100B exhaust their respective exhaust products 130 using a single set of exhaust lines 150.

For example, a line 158A from the exhaust outlet 125A of the deposition system 100A may connect to a line 158B from the exhaust outlet 125B of the deposition system 100B such that a single line 158 conducts the combined exhaust products 130 from both deposition systems 100A and 100B. The exhaust lines 150 shown in FIG. 1C may also include one or more components 154. As examples, an isolation valve 154A and a manual valve 154B are labeled in FIG. 1C. It should be noted that not all components 154 of the exhaust lines 150 shown in FIG. 1C are individually labeled, and in other embodiments the exhaust lines 150 may include different components 154 or different configurations of components 154 than those shown in FIG. 1C. The deposition systems, exhaust lines, and other components shown in FIGS. 1A through 1C are illustrative examples, and other possible configurations or arrangements are considered within the scope of the present disclosure.

With reference to FIG. 1A, the exhaust lines 150 may include a coating 152 formed on surfaces of one or more of the lines 158 or one or more of the components 154, in accordance with some embodiments. The coating 152 may also be formed on the lines 158 or components 154 of the exhaust lines 150 shown in FIG. 1C, though the coating 152 is not separately shown in FIG. 1C. In some embodiments, the coating 152 may comprise one or more layers of a hydrophobic material, such as polytetrafluoroethene (e.g., Teflon) or a similar material. The coating 152 may be formed on inner surfaces (e.g., on surfaces that may be exposed to the exhaust products 130) of one or more lines 158 or components 154 in order to protect the inner surfaces from the exhaust products 130 and to suppress the exhaust products 130 from depositing or accreting material on the inner surfaces of the exhaust lines 150. In some embodiments, the coating 152 may extend completely around the circumference of an inner surface of the part. In some embodiments, the entire inner surface of a part (e.g., of a pipe section, a connector, a valve, etc.) may be covered by the coating 152. In some embodiments, only the portions of the inner surface of a part that may be exposed to one or more precursors are covered by the coating 152. In some embodiments, the portions of the inner surface of a part that are not exposed to one or more precursors are substantially free of the coating 152. In addition to the exhaust lines 150, the coating 152 may be formed on the surfaces of any components of the deposition system 100 that may be exposed to one or more precursors.

As an example, during an ALD process performed in a deposition chamber 103 to deposit a thin film of material (e.g. an oxide or another thin-film material), the exhaust products 130 may include one or more of the precursors used for forming the thin-film material. In some cases in which a coating 152 is not present, some of the precursors may adhere to inner surfaces of the exhaust lines 150 (e.g., interior surface regions of the lines 158 or components 154). The precursors present in the exhaust products 130 may also react at these inner surfaces to form layers of the thin-film material on the inner surfaces. In this manner, the exhaust products 130 may form a build-up comprising multiple layers of a thin-film material. In some cases, the build-up of thin-film material may be as thick as about 20 μm or more, particularly after multiple uses of the deposition system 100. The build-up may include a combination of thin-film materials, particulates, residue, or other substances, in some cases.

However, as described herein, a coating 152 formed on inner surfaces of the exhaust lines 150 can reduce the formation of thin-film material within the exhaust lines 150. For example, due to the hydrophobic properties of the coating 152, one or more of the precursors present in the exhaust products 130 may be unlikely to chemically bond or adhere to the coating 152. Thus, forming the coating 152 on inner surfaces of the exhaust lines 150 can suppress adhesion of the precursors, and consequently also suppress formation of thin-film material on the inner surfaces. An example of the coating 152 suppressing the formation of aluminum oxide on inner surfaces of the exhaust lines 150 is described below with respect to FIGS. 3A and 3B. In some cases, the coating 152 may also suppress adhesion of other substances within the exhaust gases 130.

A build-up of thin-film material on inner surfaces of the exhaust lines 150 can cause various problematic issues such as flow restriction in lines or components, increased amounts of particulates, flakes of the thin-film material peeling off the inner surfaces, clogging of components due to build-up or flakes, clogging or damage of pumps due to build-up or flakes, reduced function or damage of mechanical components due to build-up or flakes, or other issues. Thus, the use of a coating 152 as described herein may reduce the chance of equipment, line, or component failure due to build-up, and may increase the usable lifetime of equipment, line, or components. This can reduce costs by reducing the frequency of repair or replacement necessary due to build-up. In some cases, the coating 152 may be used instead of a separate trapping system within the exhaust lines 150 in order to reduce build-up, and thus the cost and facility space required for a trapping system may be saved.

In some embodiments, the coating 152 may be formed on surfaces of lines 158 or components 154 other than the inner surface. For example, some or all of other surfaces of a line 158 or component 154 may be coated with the coating 152 in addition to the inner surfaces. In some embodiments, some of the lines 158 or components 154 of the exhaust lines 150 may be free of the coating 152. For example, a line 158 or a component 154 that is typically exposed to small amounts or no amount of the exhaust products 130 may be uncoated. In some embodiments, the coating 152 may be formed on the individual lines 158 or components 154 of a set of exhaust lines 150 before they are assembled into the set of exhaust lines 150. In some embodiments, some of the individual lines 158 or components 154 of a set of exhaust lines 150 may be assembled before forming the coating 152 on those lines 158 or components 154.

The coating 152 may be formed on a part (e.g. a line 158 or component 154 of the exhaust lines 150) using any suitable technique. In some embodiments, an optional surface preparation process may be performed on the part prior to formation of the coating 152. In some embodiments, the surface preparation process comprises a pre-bake process in which the part is heated to remove contamination or residue present on surfaces of the part. In some embodiments, the surface preparation process comprises a grit blasting process in which grit or other particulates are sprayed at the part at high velocity to clean and/or roughen the surface. In some embodiments, the surface preparation process includes coating surfaces of the part with a resin or adhesive. In some embodiments, the material of the coating 152 may be applied by spraying the material of the coating 152 onto the appropriate inner or outer surfaces of the part. The material of the coating 152 may be sprayed in a liquid form, an aerosol form, a powder form, or the like, and may be sprayed using a compressed air spraying system, an electrostatic spraying system, or the like. In some embodiments, after applying the material of the coating 152, a curing process is performed. In some embodiments, the coating 152 may be applied to multiple parts simultaneously, for example, in a batch process. In some embodiments, the coating 152 may be applied to a thickness between about 1 μm and about 200 μm, though other thicknesses are possible.

FIGS. 2A through 2E show intermediate stages in the formation of a build-up of aluminum oxide ($Al_2O_3$) layers 212 on an inner surface 202 without a coating 152, in accordance with some embodiments. The inner surface 202 may be, for example, an inner surface of a line 158 or a component 154 of a set of exhaust lines 150. In the example shown in FIGS. 2A through 2E, the inner surface 202 is exposed to exhaust products 130 from a deposition system 100 that forms a thin film of aluminum oxide within a deposition chamber 103. The deposition system 100 may form the thin film of aluminum oxide using e.g., an ALD process. The exhaust products 130 comprise a first precursor 210A and a second precursor 210B used by the ALD process to form the thin film of aluminum oxide. The first precursor 210A is trimethylaluminum ($Al(CH_3)_3$), also referred to as "TMA," and the second precursor 210B is water ($H_2O$), though the precursors may be different in other cases, such as when a thin film other than aluminum oxide is formed. The exhaust products 130 may also comprise other substances, such as reaction byproducts, purge gases, particulates, other gases or compounds, or the like.

Figures 2A, 2B, 2C, 2D, 2E:
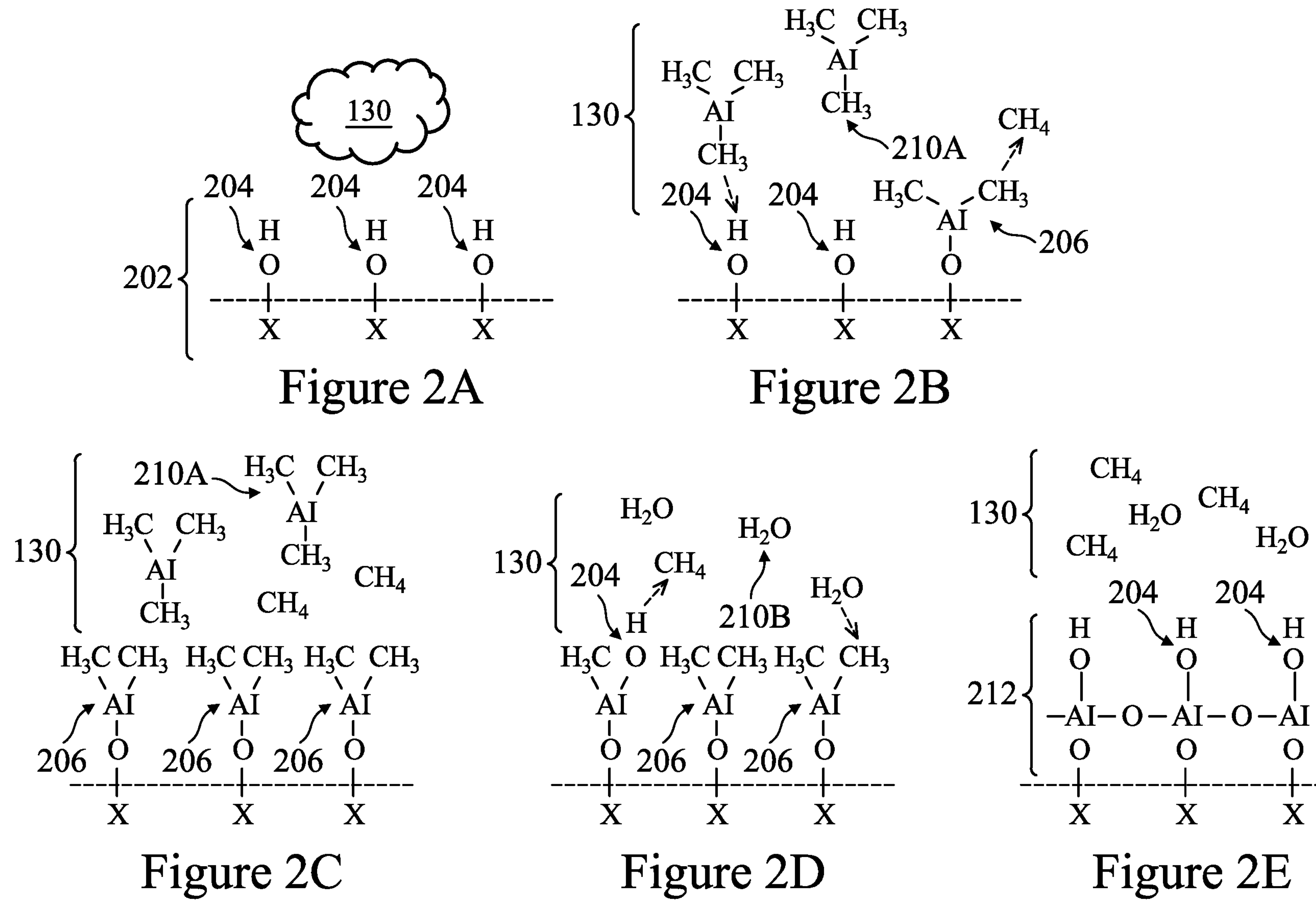
FIGS. 2A through 2E illustrate intermediate steps in the formation of an aluminum oxide build-up, in accordance with some embodiments.

FIG. 2A shows a schematic of an inner surface 202 of a part of the exhaust lines 150, in accordance with some embodiments. In FIG. 2A, the symbol "X" indicates atoms or compounds that form the material of the part, which may comprise one or more materials described previously, such as stainless steel. The inner surface 202 comprises terminal groups that are exposed to the exhaust products 130. The terminal groups shown in FIG. 2A are shown as being hydroxyl (OH) terminal groups 204, but the terminal groups may comprise different groups or combinations of groups in other cases.

In FIGS. 2B and 2C, first precursors 210A within the exhaust products 130 react with hydroxyl terminal groups 204 on the inner surface 202. As shown in FIG. 2B, the OH bonds of a hydroxyl terminal group 204 are broken, and the terminal hydrogen atom is removed. A methyl ($CH_3$) group of the first precursor 210A bonds to the removed hydrogen atom to form methane ($CH_4$) as a reaction byproduct. The aluminum atom of the first precursor 210A bonds to the remaining terminal oxygen atom of the hydroxyl terminal group 204, forming a second terminal group 206. In this manner, first precursors 210A may react to multiple hydroxyl terminal groups 204 to form multiple second terminal groups 206, as shown in FIG. 2C. In some cases, the first precursors 210A may react with terminal groups other than hydroxyl terminal groups 204. The formation of second terminal groups 206 is a self-limiting reaction, as the number of second terminal groups 206 that can be formed is limited by the number of available terminal groups with which the first precursors 210A can react.

In FIGS. 2D and 2E, second precursors 210B within the exhaust products 130 react with second terminal groups 206 on the inner surface 202, forming an aluminum oxide layer 212. As shown in FIG. 2D, the bond between a methyl group and the aluminum atom of a second terminal group 206 is broken, and a second precursor 210B reacts to form a hydroxyl terminal group 204 bonded to the aluminum atom and methane as a reaction byproduct. In this manner, multiple second precursors 210B have their methyl groups replaced by hydroxyl terminal groups 204. As shown in FIG. 2E, as methyl groups of adjacent second terminal groups 206 are removed, the second precursors 210B react such that an oxygen atom of a second precursor 210B is bonded to multiple adjacent aluminum atoms, forming an aluminum oxide layer 212. This reaction also forms hydroxyl terminal groups 204, which may then react with first precursors 210A within the exhaust products 130 and begin forming another aluminum oxide layer 212 over the aluminum oxide layer 212 by the same reactions described in FIGS. 2A through 2E. In this manner, multiple aluminum oxide layers 212 may be formed due to prolonged or repeated exposure to exhaust products 130, forming a build-up of aluminum oxide layers 212 on inner surfaces 202 of the exhaust lines 150.

Figures 3A, 3B:
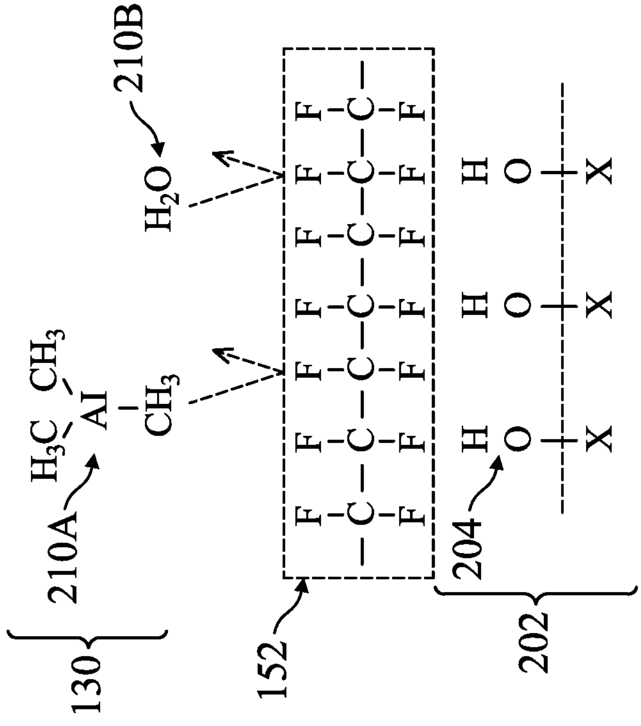
FIGS. 3A and 3B illustrate a coating formed on an exhaust system, in accordance with some embodiments.

Turning to FIGS. 3A and 3B, an inner surface 202 of exhaust lines 150 with a coating 152 is shown, in accordance with some embodiments. FIG. 3A shows an inner surface 202 similar to that shown in FIGS. 2A through 2E, but a coating 152 of polytetrafluoroethene (e.g., Teflon) has been formed over the inner surface 202 to protect it from the exhaust products 130. FIGS. 3A and 3B show the coating 152 having a single layer of polytetrafluoroethene, but the coating 152 may include multiple layers of polytetrafluoroethene or other materials. As shown in FIG. 3B, the coating 152 prevents the precursors 210A and 210B from bonding or adhering to the inner surfaces 202. For example, due to polytetrafluoroethene comprising a fluorine-passivated carbon chain, the exposed surface of the coating 152 is hydrophobic and does not react with either the first precursor 210A or the second precursor 210B. In this manner, the precursors 210A and 210B are much less likely to react to form aluminum oxide layers 212 on the inner surface 202. For example, the growth rate of aluminum oxide layers 212 on an inner surface 202 covered by the coating 152 may be between about 0% and about 10% of the growth rate of aluminum oxide layers 212 on an inner surface 202 that is not covered by the coating 152.

FIGS. 2A through 3B describe an example of the formation of aluminum oxide layers 212 and how the coating 152 suppresses this formation. However, the coating 152 may also reduce build-up of materials other than aluminum oxide. For example, the coating 152 may reduce build-up of other oxides such as lanthanum oxide ($La_2O_3$), hafnium oxide ($HfO_2$), hafnium oxynitride (HfON), zirconium oxide ($ZrO_2$), zinc oxide (ZnO), aluminum nitride (AlN), other dielectric materials including high-k dielectric materials, combinations of these, or the like. For example, the coating 152 may reduce the chance of reactions between other precursors in a similar manner as described for FIGS. 3A and 3B. In addition to reducing build-up due to exhaust products 130 from an ALD process, the coating 152 may also reduce build-up due to exhaust products 130 from other types of processes such as dry etching processes, CVD processes, PVD processes, other ALD processes (e.g., a thermal ALD process), or the like.

Advantages provided by the embodiments described herein may include improving the lifetime of deposition systems, exhaust systems, vacuum systems, or components thereof that are used for semiconductor processing. Additionally, the embodiments described herein may reduce the down-time and maintenance cost of these systems, thereby reducing the cost of manufacturing semiconductor devices. For example, by forming the coating described herein on surfaces of an exhaust system (e.g., on surfaces of forelines, pumping lines, valves, connectors, junctions, etc.), the undesired build-up of material (e.g., aluminum oxide or other materials) on those surfaces may be prevented or reduced. The use of the coating as described herein can provide the advantages without requiring changes to any deposition processes or recipes. The use of the coating may also cost less than other techniques, such as the use of a trapping system.

In an embodiment, an apparatus includes a first semiconductor processing chamber, a precursor delivery system coupled to the first semiconductor processing chamber, a first exhaust line coupled to the first semiconductor processing chamber, wherein an interior surface of the first exhaust line is coated with a layer of hydrophobic material, the layer of hydrophobic material having exposed hydrophobic surfaces, and a vacuum pump coupled to the first exhaust line. In an embodiment, the hydrophobic material includes polytetrafluoroethene. In an embodiment, the first exhaust line includes a pipe made of stainless steel. In an embodiment, the precursor delivery system is configured to inject precursors into the first semiconductor processing chamber, wherein the precursors react within the first semiconductor processing chamber to form a thin film layer. In an embodiment, the thin film layer includes aluminum oxide. In an embodiment, the precursors do not react with the hydrophobic surfaces of the hydrophobic material. In an embodiment, one of the precursors includes water ($H_2O$). In an embodiment, the apparatus includes a second semiconductor processing chamber coupled to the first exhaust line. In an embodiment, the first semiconductor processing chamber is part of an atomic layer deposition (ALD) system.

In an embodiment, a deposition system includes a deposition chamber, a first precursor supply configured to inject trimethylaluminum ($Al(CH_3)_3$) into the deposition chamber, a second precursor supply configured to inject water ($H_2O$) into the deposition chamber, an exhaust system configured to transfer exhaust gases from the deposition chamber, the exhaust system comprising multiple pipe sections, and a layer of polytetrafluoroethene covering the inner surface of at least one pipe section of the multiple pipe sections. In an embodiment, the layer of polytetrafluoroethene has a thickness between 1 μm and 200 μm. In an embodiment, the layer of polytetrafluoroethene extends completely around an inner surface of the at least one pipe section. In an embodiment, the layer of polytetrafluoroethene suppresses adhesion of the exhaust gases on the inner surface of the at least one pipe section. In an embodiment, the deposition system includes a vacuum pump connected to the exhaust system. In an embodiment, the exhaust system includes a valve, wherein a layer of polytetrafluoroethene covers an inner surface of the valve.

In an embodiment, a method of forming a semiconductor device includes forming a hydrophobic coating on an inner surface of an exhaust line, connecting the exhaust line to a semiconductor processing chamber, introducing a first precursor into the semiconductor processing chamber, introducing a second precursor into the semiconductor processing chamber, wherein the first precursor reacts with the second precursor to form a layer of oxide material, and pumping the first precursor and the second precursor from the semiconductor processing chamber and through the exhaust line. In an embodiment, the hydrophobic coating includes polytetrafluoroethene. In an embodiment, the oxide material includes halfnium oxide ($HfO_2$). In an embodiment, the first precursor includes trimethylaluminum ($Al(CH_3)_3$). In an embodiment, forming the hydrophobic coating includes spraying a hydrophobic material on the inner surface, followed by a curing process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:

depositing a hydrophobic coating on an inner surface of an exhaust line, wherein the hydrophobic coating conformally coats the inner surface;

connecting the exhaust line to a semiconductor processing chamber;

introducing a first precursor into the semiconductor processing chamber;

introducing a second precursor into the semiconductor processing chamber, wherein the first precursor reacts with the second precursor to form a layer of oxide material; and pumping the first precursor and the second precursor from the semiconductor processing chamber and through the exhaust line.

2. The method of claim 1, wherein the hydrophobic coating comprises polytetrafluoroethene.

3. The method of claim 1, wherein the oxide material comprises halfnium oxide ($HfO_2$).

4. The method of claim 1, wherein the first precursor comprises trimethylaluminum ($Al(CH_3)_3$).

5. The method of claim 1, wherein forming the hydrophobic coating comprises spraying a hydrophobic material on the inner surface, followed by a curing process.

6. The method of claim 1, wherein forming the hydrophobic coating comprises roughening the inner surface.

7. The method of claim 1, wherein the hydrophobic coating is a solid coating.

8. The method of claim 1, wherein the hydrophobic coating has a thickness between 40 μm and 200 μm.

9. A method comprising: coating the interior surfaces of a plurality of exhaust line components with a conformal hydrophobic layer; after coating with the hydrophobic layer, assembling the exhaust line components to form an exhaust system, wherein the exhaust system is coupled to a processing chamber of a deposition system; placing a substrate in the processing chamber of the deposition system; and depositing an oxide on the substrate using the deposition system, comprising venting materials in the processing chamber through the exhaust system.

10. The method of claim 9, wherein the deposition system is an atomic layer deposition (ALD) system.

11. The method of claim 9, wherein the hydrophobic coating comprises polytetrafluoroethene.

12. The method of claim 9, wherein the oxide is an aluminum oxide.

13. The method of claim 9 further comprising coating the exterior surfaces of the plurality of exhaust line components with the hydrophobic layer.

14. The method of claim 9, wherein coating the interior surfaces comprises:

roughening the interior surfaces using a blasting process;

baking the plurality of exhaust line components;

depositing the hydrophobic layer on the interior surfaces; and after depositing the hydrophobic layer, performing a curing process.

15. The method of claim 9, wherein the plurality of exhaust line components comprises a pumping line.

16. A method comprising:

depositing a conformal and continuous first layer of polytetrafluoroethene on exposed interior surfaces along the venting path of an exhaust system of an atomic layer deposition (ALD) system;

introducing a first precursor into a processing chamber of the ALD system, wherein the processing chamber is connected to the exhaust system;

venting the first precursor from the processing chamber and into the venting path;

introducing water into the processing chamber; and venting the water from the processing chamber and into the venting path.

17. The method of claim 16 further comprising roughening the exposed surfaces along the venting path.

18. The method of claim 16, wherein the first precursor is trimethylaluminum ($Al(CH_3)_3$).

19. The method of claim 16, wherein the same first layer of polytetrafluoroethene extends continuously across the interior surfaces of two or more components of the exhaust system.

20. The method of claim 16 further comprising depositing a second layer of polytetrafluoroethene on the first layer of polytetrafluoroethene.

* * * * *